US010719097B1

(12) United States Patent
Chuang et al.

(10) Patent No.: US 10,719,097 B1
(45) Date of Patent: Jul. 21, 2020

(54) VOLTAGE REGULATION CIRCUIT SUITABLE TO PROVIDE OUTPUT VOLTAGE TO CORE CIRCUIT

(71) Applicant: VANGUARD INTERNATIONAL SEMICONDUCTOR CORPORATION, Hsinchu (TW)

(72) Inventors: Jung-Tsun Chuang, Tainan (TW); Shao-Chang Huang, Hsinchu (TW); Wen-Tsung Wang, Taichung (TW); Chieh-Yao Chuang, Kaohsiung (TW); Chi-Hung Lo, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/440,191

(22) Filed: Jun. 13, 2019

(51) Int. Cl.
*G05F 1/575* (2006.01)
*G05F 1/613* (2006.01)

(52) U.S. Cl.
CPC .............. *G05F 1/575* (2013.01); *G05F 1/613* (2013.01)

(58) Field of Classification Search
CPC ... G05F 1/10; G05F 1/46; G05F 1/461; G05F 1/462; G05F 1/56; G05F 1/561; G05F 1/562; G05F 1/563; G05F 1/565; G05F 1/571; G05F 1/575; G05F 1/613; G05F 1/614; H02M 3/02; H02M 3/04; H02M 3/10; H02M 3/145; H02M 3/155; H02M 3/156; H02M 3/158; H02M 3/1584; H02M 2001/0006; H02M 2001/0016; H02M 2001/0019; H02M 2001/0022; H02M 2001/0025; H02M 2001/0032; H02M 2003/1566; H02M 1/08; H02M 1/088
(Continued)

(56) References Cited

U.S. PATENT DOCUMENTS

| 6,768,339 B2 * | 7/2004 | Von Thun | H03K 17/162 326/21 |
| 7,239,176 B2 * | 7/2007 | Gupta | H03K 19/00315 326/68 |
| 2002/0101272 A1 * | 8/2002 | Bales | H03K 19/00315 327/310 |

FOREIGN PATENT DOCUMENTS

| CN | 101079650 B | 1/2012 |
| CN | 206258757 U | 6/2017 |

(Continued)

OTHER PUBLICATIONS

Taiwanese Office Action and Search Report, dated Sep. 17, 2019, for Taiwanese Application No. 108114838.

*Primary Examiner* — Alex Torres-Rivera
*Assistant Examiner* — Carlos O Rivera-Perez
(74) *Attorney, Agent, or Firm* — Birch, Stewart, Kolasch & Birch, LLP (57) ABSTRACT

A voltage regulation circuit is suitable to provide an output voltage to a core circuit. The voltage regulation circuit includes a pad, a pull-low unit, a first controlling unit, a second controlling unit and a voltage regulation circuit. The pad receives and provides an input voltage. The pull-low unit generates a pull-low voltage according to the input voltage. The first controlling unit generates a first controlling signal according to the input voltage and the pull-low voltage. The second controlling unit generates a second controlling signal according to the input voltage and the first controlling signal. The voltage regulation unit regulates the input voltage according to the first controlling signal and the second controlling signal, so as to generate the output voltage.

7 Claims, 5 Drawing Sheets

(58) Field of Classification Search
USPC ........ 323/222–226, 265, 266, 269–275, 280, 323/282–286, 299–303, 304, 311–317, 323/351
See application file for complete search history.

(56) References Cited

FOREIGN PATENT DOCUMENTS

| | | |
|---|---|---|
| CN | 104035468 B | 11/2017 |
| CN | 105700612 B | 6/2018 |
| TW | 200810340 A | 2/2008 |
| TW | 200943712 A | 10/2009 |
| TW | 201011490 A | 3/2010 |
| TW | 201145830 A1 | 12/2011 |

\* cited by examiner

VOLTAGE REGULATION CIRCUIT SUITABLE TO PROVIDE OUTPUT VOLTAGE TO CORE CIRCUIT

BACKGROUND OF THE INVENTION

Field of the Invention

The present invention relates to a regulation circuit, and in particular it relates to a voltage regulation circuit.

Description of the Related Art

With the advancement of technology, there are more types of electronic devices available on the market, and these electronic devices have more and more functions. In general, many integrated circuits are mounted inside an electronic device. Each of the integrated circuits may receive many operation voltages, wherein the operation voltages are different.

However, when an integrated circuit uses an input voltage that exceeds its required operation voltage, the integrated circuit may be damaged or experience abnormal operation. Therefore, the design of the above structure still needs to be improved.

BRIEF SUMMARY OF THE INVENTION

An embodiment of the present invention provides a voltage regulation circuit, thereby avoiding situations wherein an unsuitable output voltage is provided to a core circuit, which may result in abnormal operation or damage to the core circuit, and increasing the security and stability of the operation of the circuit.

An embodiment of the present invention provides a voltage regulation circuit suitable to provide an output voltage to a core circuit. The voltage regulation circuit includes a pad, a pull-down unit, a first control unit, a second control unit and a voltage regulation unit. The pad is configured to receive and provide an input voltage. The pull-down unit is coupled to the pad. The pull-down unit is configured to receive the input voltage and generate a pull-down voltage according to the input voltage. The first control unit is coupled to the pad and the pull-down unit. The first control unit is configured to receive the input voltage and the pull-down voltage and generate a first control signal according to the input voltage and the pull-down voltage. The second control unit is coupled to the pad and the first control unit. The second control unit is configured to receive the input voltage and the first control signal and generate a second control signal according to the input voltage and the first control signal. The voltage regulation unit is coupled to the pad, the first control unit and the second control unit. The voltage regulation unit is configured to receive the input voltage, the first control signal and the second control signal and regulate the input voltage according to the first control signal and the second control signal, so as to generate the output voltage.

According to the voltage regulation circuit disclosed by the embodiment of the present invention, the pull-down unit generates the pull-down voltage according to the input voltage. The first control unit generates the first control signal according to the input voltage and the pull-down voltage. The second control unit generates the second control signal according to the input voltage and the first control signal. The voltage regulation unit regulates the input voltage according to the first control signal and the second control signal, so as to generate the output voltage. Therefore, the embodiment of the present invention may effectively avoid situations wherein an unsuitable output voltage is provided to a core circuit, which may result in abnormal operation or damage to the core circuit, and increase the security and stability of the operation of the circuit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In each of the following embodiments, the same reference number represents the same or similar element or component.

Figure 1:
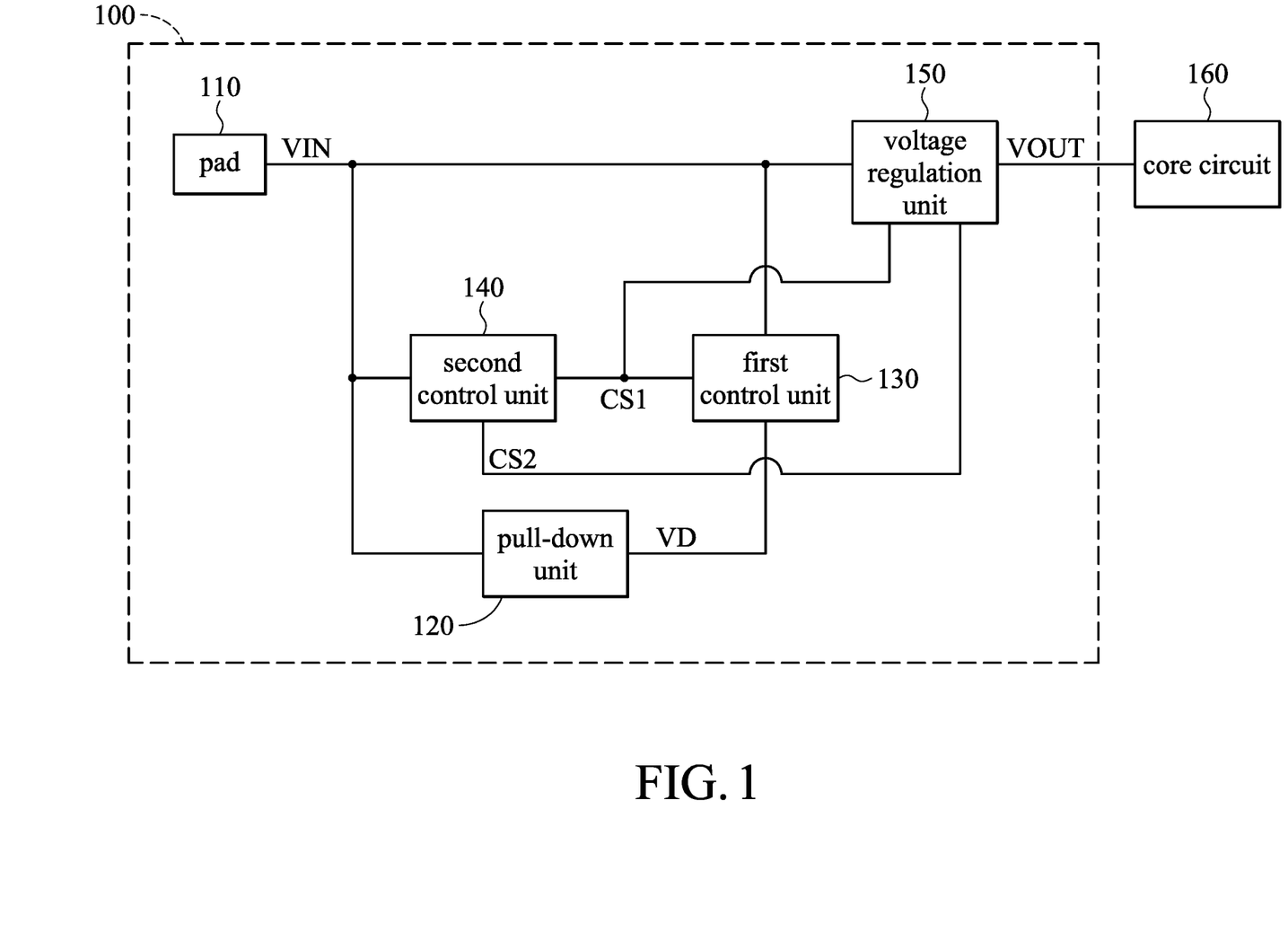
FIG. 1 shows a schematic view of a voltage regulation circuit according to an embodiment of the present invention.

FIG. 1 shows a schematic view of a voltage regulation circuit according to an embodiment of the present invention. Please refer to FIG. 1. In the embodiment, the voltage regulation circuit 100 is suitable to provide an output voltage VOUT to a core circuit 160, so that the core circuit 160 may obtain a required working voltage to maintain a normal operation.

The voltage regulation circuit 100 includes a pad 110, a pull-down unit 120, a first control unit 130, a second control unit 140 and a voltage regulation unit 150. The pad 110 is configured to receive and provide an input voltage VIN. The pull-down unit 120 is coupled to the pad 110. The pull-down unit 120 is configured to receive the input voltage VIN and generate a pull-down voltage VD according to the input voltage VIN.

The first control unit 130 is coupled to the pad 110 and the pull-down unit 120. The first control unit 130 is configured to receive the input voltage VIN and the pull-down voltage VD and generate a first control signal CS1 according to the input voltage VIN and the pull-down voltage VD. The second control unit 140 is coupled to the pad 110 and the first control unit 130. The second control unit 140 is configured to receive the input voltage VIN and the first control signal CS1 and generate a second control signal CS2 according to the input voltage VIN and the first control signal CS1.

The voltage regulation unit 150 is coupled to the pad 110, the first control unit 130 and the second control unit 140. The voltage regulation unit 150 is configured to receive the input voltage VIN, the first control signal CS1 and the second control signal CS2 and regulate the input voltage VIN according to the first control signal CS1 and the second control signal CS2, so as to generate the output voltage VOUT.

When the input voltage VIN is less than or equal to a predetermined value, the first control unit 130 regulates the voltage level of the first control signal CS1 and the second control unit 140 regulates the voltage level of the second control signal CS2, so that the voltage regulation unit 150 maintains the voltage level of the input voltage VIN to generate the output voltage VOUT. In the embodiment, the predetermined value is, for example, the required working voltage of the core circuit 160, and the predetermined value is, for example, 1.8V.

That is, when the input voltage VIN is less than or equal to the predetermined value (such as 1.8V), it indicates that the input voltage VIN may be supplied to the core circuit 160. The first control unit 130 may regulate the voltage level of the first control signal CS1, and the second control unit 140 may regulate the voltage level of the second control signal CS2. Then, the voltage regulation unit 150 may maintain the voltage level of the input voltage VIN according to the voltage level of the first control signal CS1 and the voltage level of the second control signal CS2, so as to generate the same output voltage VOUT as the voltage level of the input voltage VIN. Afterward, the output voltage VOUT is provided to the core circuit 160.

In addition, when the input voltage VIN is greater than the predetermined value, the first control unit 130 regulates the voltage level of the first control signal CS1 and the second control unit 140 regulates the voltage level of the second control signal CS2, so that the voltage regulation unit 150 decreases the voltage level provided by the input voltage VIN to generate the output voltage VOUT.

That is, when the input voltage VIN is greater than the predetermined value (such as 1.8V), it indicates that the input voltage VIN is greater than the required working voltage of the core circuit 160. The first control unit 130 may regulate the voltage level of the first control signal CS1, and the second control unit 140 may regulate the voltage level of the second control signal CS2. Then, the voltage regulation unit 150 may decrease the voltage level provided by the input voltage VIN according to the voltage level of the first control signal CS1 and the voltage level of the second control signal CS2. For example, the voltage regulation unit 150 decreases the voltage level provided by the input voltage VIN to the same voltage level as the predetermined value, so as to generate the output voltage VOUT that is the same as the predetermined value. Afterward, the output voltage VOUT is provided to the core circuit 160.

It can be seen that when the input voltage VIN is less than or equal to the predetermined value, the voltage regulation circuit 100 directly uses the input voltage VIN as the output voltage VOUT and provides the output voltage VOUT to the core circuit 160. When the input voltage VIN is greater than the predetermined value, the voltage regulation circuit 100 decreases the voltage level provided by the input voltage VIN, uses the decreased voltage level as the output voltage VOUT, and provides the output voltage VOUT to the core circuit 160. Therefore, the voltage regulation circuit 100 may avoid situations wherein the unsuitable output voltage VOUT is provided to the core circuit 160, which may result in abnormal operation or damage to the core circuit 160, and increase the security and stability of the operation of the circuit.

Figure 2:
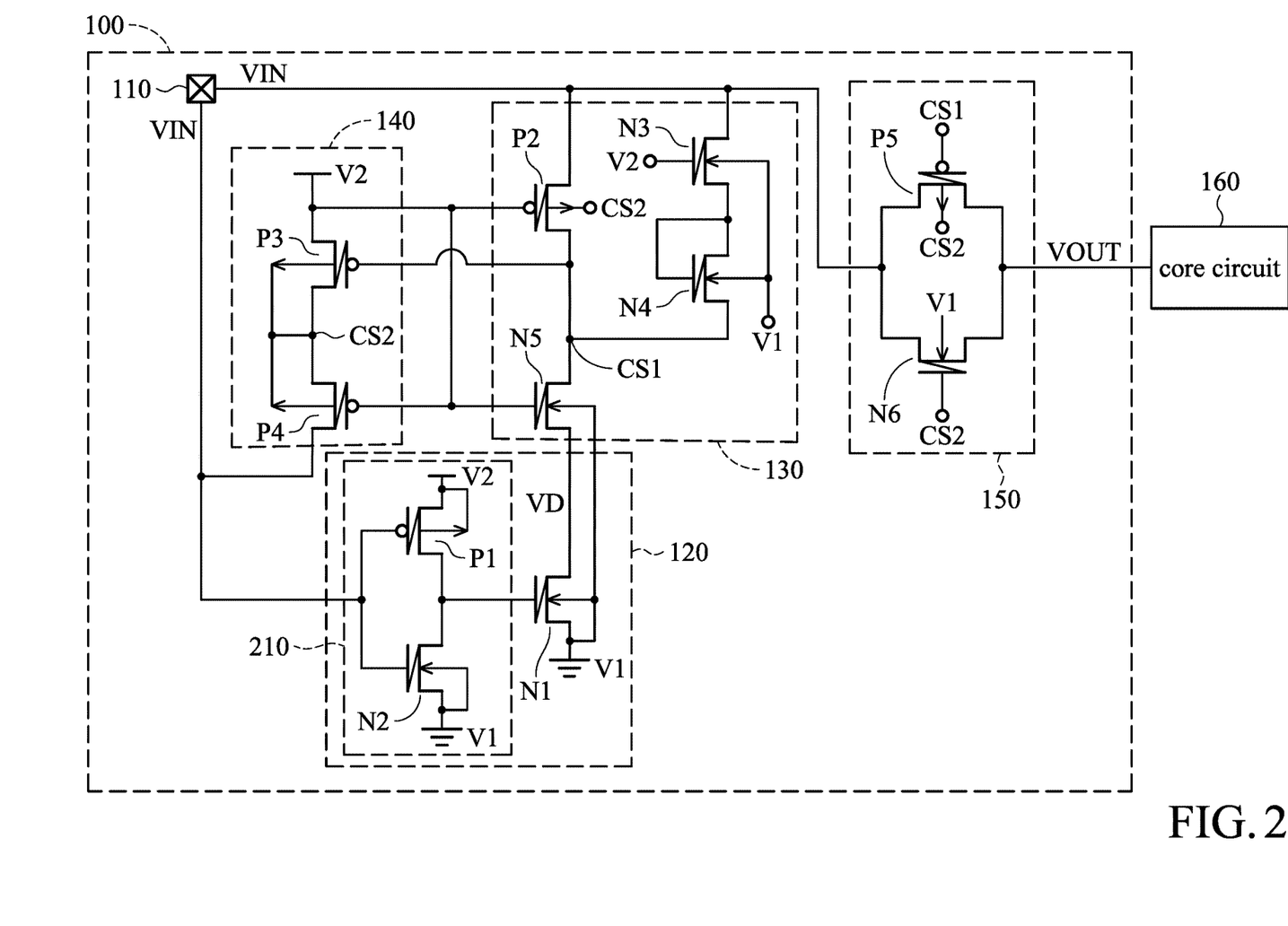
FIG. 2 shows a schematic view of a detailed circuit of a voltage regulation circuit according to an embodiment of the present invention.

FIG. 2 shows a schematic view of a detailed circuit of a voltage regulation circuit according to an embodiment of the present invention. Please refer to FIG. 2. The pull-down unit 120 includes an inverter 210 and a transistor N1. The inverter 210 has an input terminal and an output terminal. The input terminal of the inverter 210 is coupled to the pad 110 and receives the input voltage VIN. The output terminal of the inverter 210 generates an inversion signal.

The transistor N1 has a first terminal, a second terminal, a third terminal and a fourth terminal. The first terminal of the transistor N1 is coupled to the output terminal of the inverter 210. The second terminal of the transistor N1 generates the pull-down voltage VD. The third terminal and the fourth terminal of the transistor N1 receive a first voltage V1. In the embodiment, the first voltage V1 is, for example, a grounding voltage GND.

Furthermore, the inverter 210 includes a transistor P1 and a transistor N2. The transistor P1 has a first terminal, a second terminal, a third terminal and a fourth terminal. The first terminal of the transistor P1 serves as the input terminal of the inverter 210 and receives the input voltage VIN. The second terminal of the transistor P1 serves as the output terminal of the inverter 210 and generates the inversion signal. The third terminal and the fourth terminal of the transistor P1 receive a second voltage V2. In the embodiment, the second voltage V2 may be a working voltage, such as 1.8V.

The transistor N2 has a first terminal, a second terminal, a third terminal and a fourth terminal. The first terminal of the transistor N2 is coupled to the first terminal of the transistor P1. The second terminal of the transistor N2 is coupled to the second terminal of the transistor P1. The third terminal and the fourth terminal of the transistor N2 receive the first voltage V1 (i.e., the grounding voltage GND).

In the embodiment, both the transistors N1 and N2 are, for example, N-type transistors. The first terminal of the transistors N1 or N2 is, for example, a gate terminal of the N-type transistor. The second terminal of the transistors N1 or N2 is, for example, a drain terminal of the N-type transistor. The third terminal of the transistors N1 or N2 is, for example, a source terminal of the N-type transistor. The fourth terminal of the transistors N1 or N2 is, for example, a base terminal of the N-type transistor.

In addition, the transistor P1 is, for example, a P-type transistor. The first terminal of the transistor P1 is, for example, a gate terminal of the P-type transistor. The second terminal of the transistor P1 is, for example, a drain terminal of the P-type transistor. The third terminal of the transistor P1 is, for example, a source terminal of the P-type transistor. The fourth terminal of the transistor P1 is, for example, a base terminal of the P-type transistor.

The first control unit 130 includes a transistor N3, a transistor N4, a transistor N5 and a transistor P2. The transistor N3 has a first terminal, a second terminal, a third terminal and a fourth terminal. The first terminal of the transistor N3 receives the second voltage V2 (i.e., the working voltage 1.8V). The second terminal of the transistor N3 is coupled to the pad 110. The fourth terminal of the transistor N3 receives the first voltage V1 (i.e., the grounding voltage).

The transistor N4 has a first terminal, a second terminal, a third terminal and a fourth terminal. The first terminal and the second terminal of the transistor N4 are coupled to the third terminal of the transistor N3. The third terminal of the transistor N4 generates the first control signal CS1. The fourth terminal of the transistor N4 receives the first voltage V1 (i.e., the grounding voltage GND).

The transistor N5 has a first terminal, a second terminal, a third terminal and a fourth terminal. The first terminal of the transistor N5 receives the second voltage V2 (i.e., the working voltage 1.8V). The second terminal of the transistor N5 is coupled to the third terminal of the transistor N4. The third terminal of the transistor N5 is coupled to the pull-down unit 120 and receives the pull-down voltage VD. The fourth terminal of the transistor N5 receives the first voltage V1 (i.e., the grounding voltage GND).

The transistor P2 has a first terminal, a second terminal, a third terminal and a fourth terminal. The first terminal of the transistor P2 receives the second voltage V2 (i.e., the working voltage 1.8V). The second terminal of the transistor P2 is coupled to the second terminal of the transistor N5. The third terminal of the transistor P2 is coupled to the pad 110. The fourth terminal of the transistor P2 receives the second control signal CS2.

In the embodiment, the transistors N3, N4 and N5 are, for example, N-type transistors. The first terminal of the transistors N3, N4 or N5 is, for example, a gate terminal of the N-type transistor. The second terminal of the transistors N3, N4 or N5 is, for example, a drain terminal of the N-type transistor. The third terminal of the transistors N3, N4 or N5 is, for example, a source terminal of the N-type transistor. The fourth terminal of the transistors N3, N4 or N5 is, for example, a base terminal of the N-type transistor.

In addition, the transistor P2 is, for example, a P-type transistor. The first terminal of the transistor P2 is, for example, a gate terminal of the P-type transistor. The second terminal of the transistor P2 is, for example, a drain terminal of the P-type transistor. The third terminal of the transistor P2 is, for example, a source terminal of the P-type transistor. The fourth terminal of the transistor P2 is, for example, a base terminal of the P-type transistor.

The second control unit 140 includes a transistor P3 and a transistor P4. The transistor P3 has a first terminal, a second terminal, a third terminal and a fourth terminal. The first terminal of the transistor P3 receives the first control signal CS1. The second terminal and the fourth terminal of the transistor P3 are coupled to each other and generate the second control signal CS2. The third terminal of the transistor P3 receives the second voltage V2 (i.e., the working voltage 1.8V).

The transistor P4 has a first terminal, a second terminal, a third terminal and a fourth terminal. The first terminal of the transistor P4 receives the second voltage V2 (i.e., the working voltage 1.8V). The second terminal and the fourth terminal of the transistor P4 are coupled to the second terminal of the transistor P3. The third terminal of the transistor P4 is coupled to the pad 110.

In addition, the transistors P3 and P4 are, for example, P-type transistors. The first terminal of the transistors P3 or P4 is, for example, a gate terminal of the P-type transistor. The second terminal of the transistors P3 or P4 is, for example, a drain terminal of the P-type transistor. The third terminal of the transistors P3 or P4 is, for example, a source terminal of the P-type transistor. The fourth terminal of the transistors P3 or P4 is, for example, a base terminal of the P-type transistor.

The voltage regulation unit 150 includes a transistor P5 and a transistor N6. The transistor P5 has a first terminal, a second terminal, a third terminal and a fourth terminal. The first terminal of the transistor P5 receives the first control signal CS1. The second terminal of the transistor P5 generates the output voltage VOUT. The third terminal of the transistor P5 is coupled to the pad 110 and receives the input voltage VIN. The fourth terminal of the transistor P5 receives the second control signal CS2.

The transistor N6 has a first terminal, a second terminal, a third terminal and a fourth terminal. The first terminal of the transistor N6 receives the second control signal CS2. The second terminal of the transistor N6 is coupled to the second terminal of the transistor P5. The third terminal of the transistor N6 is coupled to the third terminal of the transistor P5. The fourth terminal of the transistor N6 receives the first voltage V1 (i.e., the grounding voltage GND).

In the embodiment, the transistor P5 is, for example, a P-type transistor. The first terminal of the transistor P5 is, for example, a gate terminal of the P-type transistor. The second terminal of the transistor P5 is, for example, a drain terminal of the P-type transistor. The third terminal of the transistor P5 is, for example, a source terminal of the P-type transistor. The fourth terminal of the transistor P5 is, for example, a base terminal of the P-type transistor.

In addition, the transistor N6 is, for example, an N-type transistor. The first terminal of the transistor N6 is, for example, a gate terminal of the N-type transistor. The second terminal of the transistor N6 is, for example, a drain terminal of the N-type transistor. The third terminal of the transistor N6 is, for example, a source terminal of the N-type transistor. The fourth terminal of the transistor N6 is, for example, a base terminal of the N-type transistor.

Furthermore, in the embodiment, the thicknesses of the process parameters used in the transistors N1 to N6 and P1 to P5 are larger than the thicknesses of the process parameters of the general transistors, and thus threshold voltages (Vth) of the transistors N1 to N6 and P1 to P5 are larger. In addition, the transistors N1 to N6 and P1 to P5 are, for example, transistors capable of operating at 5V.

The internal components and the arrangement relationship thereof of the voltage adjustment circuit 100 have been described above, and the operation of the voltage adjustment circuit 100 will be described below by way of some embodiments.

Figure 3:
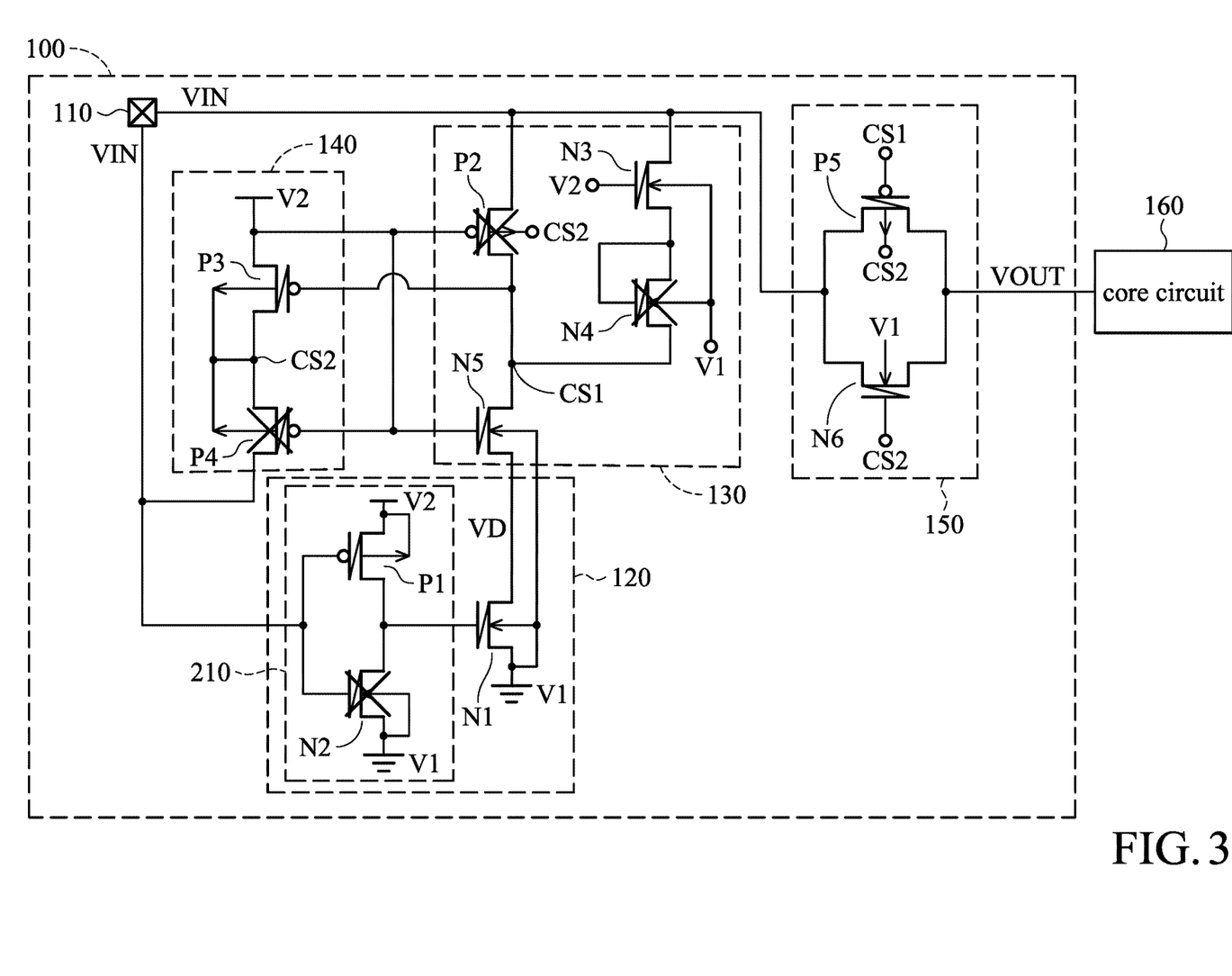
FIG. 3 shows a schematic view of an operation of a voltage regulation circuit according to an embodiment of the present invention.

FIG. 3 shows a schematic view of an operation of a voltage regulation circuit according to an embodiment of the present invention. It is assumed that the input voltage VIN is 0V, i.e., the input voltage VIN is less than the predetermined value.

Firstly, since the input voltage VIN is 0V, the transistor P1 of the inverter 210 is turned on and the transistor N2 of the inverter 210 is turned off, and the inversion signal outputted by the output terminal of the inverter 210 is the second voltage V2 (i.e., the working voltage 1.8V). Since the inversion signal is the second voltage V2 (i.e., the working voltage 1.8V), the transistor N1 is turned on, the pull-down voltage VD generated by the second terminal of the transistor N1 is the first voltage V1 (i.e., the grounding voltage GND). That is, the pull-down unit 120 generates the pull-down voltage VD with the first voltage V1.

In addition, since the input voltage VIN is 0V, the transistor N3 is turned on, and the transistor N4 and the transistor P2 are turned off. Since the first terminal (such as the gate terminal) of the transistor N5 receives the second voltage V2 (i.e., the working voltage 1.8V) and the third terminal (such as the source terminal) of the transistor N5 receives the pull-down voltage VD with the first voltage V1, the transistor N5 is turned on, and the first control signal CS1 generated by the second terminal of the transistor N5 is the first voltage V1 (i.e., the grounding voltage GND). That is, the first control unit 130 generates the first control signal CS1 with the first voltage V1.

Since the first terminal (such as the gate terminal) of the transistor P3 receives the first control signal CS1 with the first voltage V1 and the third terminal (such as the source terminal) of the transistor P3 receives the second voltage V2 (i.e., the working voltage 1.8V), the transistor P3 is turned on, and the second control signal CS2 generated by the second terminal (such as the drain terminal) of the transistor P3 is the second voltage V2 (i.e., the working voltage 1.8V). That is, the second control unit 140 generates the second control signal CS2 with the second voltage V2 (i.e., the working voltage 1.8V). Since the first terminal (such as the gate terminal) of the transistor P4 receives the second voltage V2 (i.e., the working voltage 1.8V) and the third terminal (such as the source terminal) of the transistor P4 receives the input voltage VIN with 0V, the transistor P4 is turned off.

Then, since the first control signal CS1 is the first voltage V1 (i.e., the grounding voltage GND) and the second control signal CS2 is the second voltage V2 (i.e., the working voltage 1.8V), the transistor P5 and the transistor N6 are turned on, and the voltage regulation unit 150 uses the input voltage VIN with 0V as the output voltage VOUT and provides the output voltage VOUT with 0V to the core circuit 160.

Figure 4:
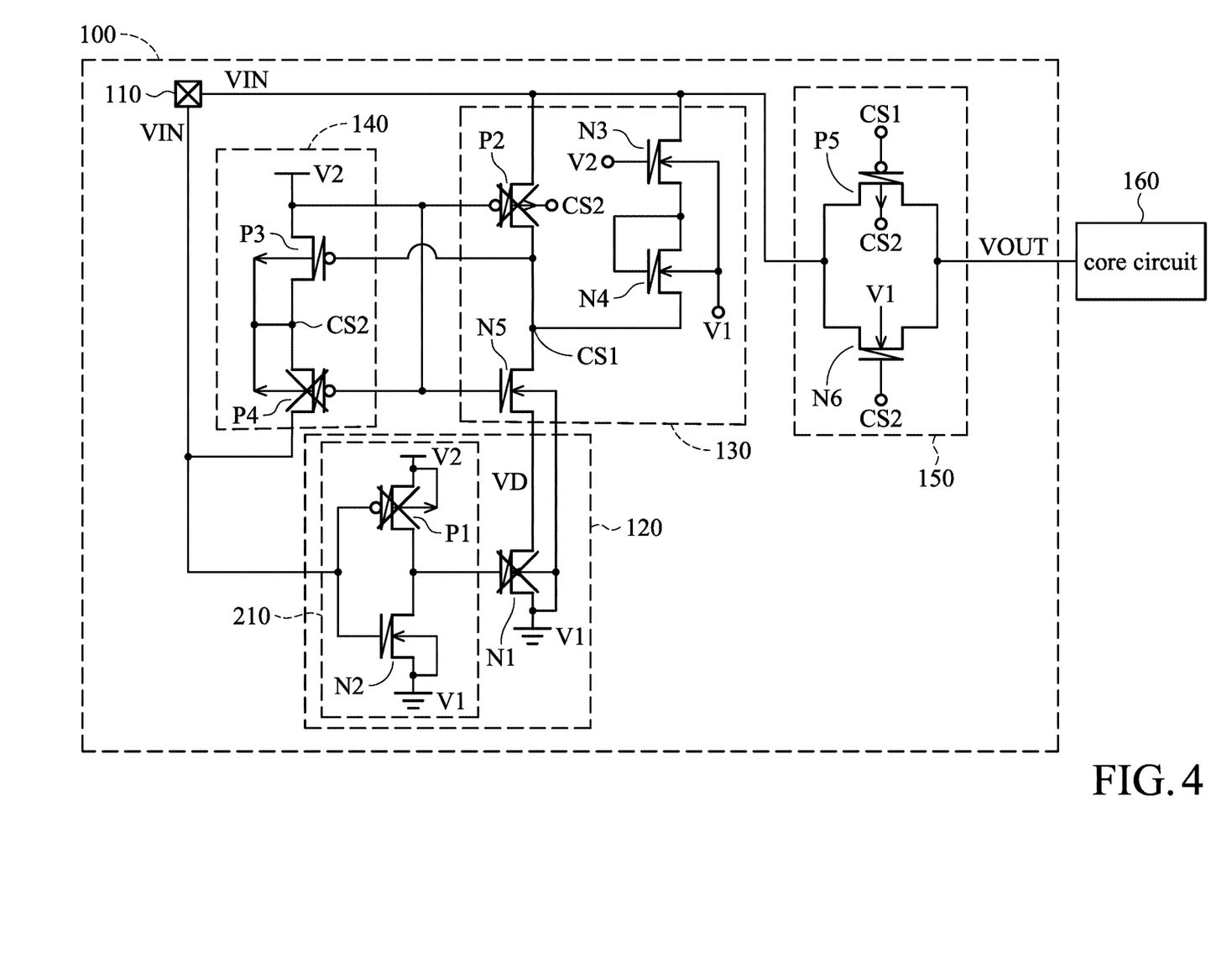
FIG. 4 shows a schematic view of an operation of a voltage regulation circuit according to another embodiment of the present invention.

FIG. 4 shows a schematic view of an operation of a voltage regulation circuit according to another embodiment of the present invention. It is assumed that the input voltage is 1.8V, i.e., the input voltage VIN equals to the predetermined value.

Firstly, since the input voltage VIN is 1.8V, the transistor P1 of the inverter 210 is turned off and the transistor N2 of the inverter 210 is turned on, and the inversion signal outputted by the output terminal of the inverter 210 is the first voltage V1 (i.e., the grounding voltage GND). Since the inversion signal is the first voltage V1 (i.e., the grounding voltage GND), the transistor N1 is turned off, and the pull-down unit 120 does not generate the pull-down voltage VD.

In addition, since the input voltage VIN is 1.8V, the transistor N3 and the transistor N4 are turned on, and the transistor P2 is turned off. Since transistor N3 and the transistor N4 are turned on, the first control signal CS1 generated by the third terminal (such as the source terminal) of the transistor N4 is 1.8-2Vth, wherein "2Vth" is the threshold voltages of the transistor N3 and the transistor N4.

Since the first terminal (such as the gate terminal) of the transistor P3 receives the first control signal CS1 with (1.8-2Vth) and the third terminal (such as the source terminal) receives the second voltage V2 (i.e., the working voltage 1.8V), the transistor P3 is turned on, and the second control signal CS2 generated by the second terminal (such as the drain terminal) of the transistor P3 is the second voltage V2 (i.e., the working voltage 1.8V). That is, the second control unit 140 generates the second control signal CS2 with the second voltage V2 (i.e., the working voltage 1.8V). Since the first terminal (such as the gate terminal) of the transistor P4 receives the second working voltage V2 (i.e., the working voltage 1.8V) and the third terminal (such as the source terminal) of the transistor P4 receives the input voltage VIN with 1.8V, the transistor P4 is turned off Then, since the first control signal CS1 is (1.8-2Vth) and the second control signal CS2 is the second voltage V2 (i.e., the working voltage 1.8V), the transistor P5 and the transistor N6 are turned on, and the voltage regulation unit 150 starts to generate the output voltage VOUT. When the transistor P5 and the transistor N6 are turned on, the output voltage VOUT are simultaneously provided by the transistor P5 and the transistor N6.

Then, when the output voltage VOUT reaches 1.8-Vth, the transistor N6 is turned off and the transistor P5 is still turned on, so that the output voltage VOUT is still provided by the transistor P5 until the output voltage VOUT reaches the same voltage level as the voltage level of the input voltage VIN with 1.8V. That is, the voltage regulation unit 150 may provide the same output voltage VOUT (i.e., 1.8V) as the voltage level of the input voltage VIN and provide the output voltage VOUT to the core circuit 160.

Figure 5:
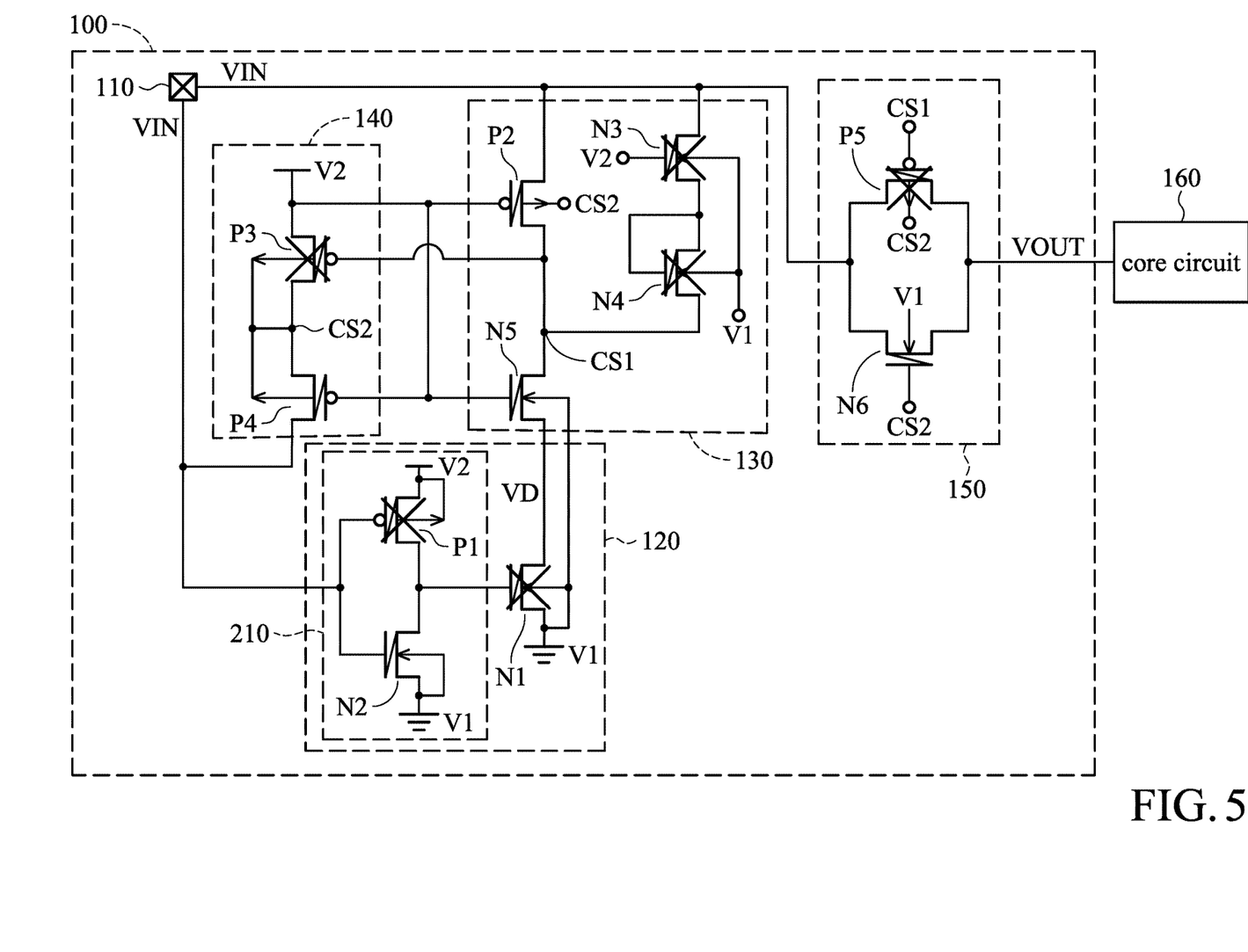
FIG. 5 shows a schematic view of an operation of a voltage regulation circuit according to another embodiment of the present invention.

FIG. 5 shows a schematic view of an operation of a voltage regulation circuit according to another embodiment of the present invention. It is assumed that the input voltage VIN is 3.3V, i.e., the input voltage VIN is greater than the predetermined value.

Firstly, since the input voltage VIN is 3.3V, the transistor P1 of the inverter 210 is turned off and the transistor N2 of the inverter 210 is turned on, and the inversion signal outputted by the output terminal of the inverter 210 is the first voltage V1 (i.e., the grounding voltage GND). Since the inversion signal is the first voltage V1 (i.e., the grounding voltage GND), the transistor N1 is turned off, and the pull-down unit 120 does not generate the pull-down voltage VD.

In addition, since the input voltage VIN is 3.3V, the transistor P2 is turned on, and the first control signal CS1 generated by the transistor P2 is 3.3V. Since the input voltage VIN is 3.3V and the first control signal CS1 is 3.3V, the transistor N3 and the transistor N4 are turned off Since the first terminal (such as the gate terminal) of the transistor P3 receives the first control signal CS1 with 3.3V and the third terminal (such as the source terminal) of the transistor P3 receives the second voltage V2 (i.e., the working voltage 1.8V), the transistor P3 is turned off. Since the first terminal (such as the gate terminal) of the transistor P4 receives the second voltage V2 (i.e., the working voltage 1.8V) and the third terminal (such as the source terminal) of the transistor P4 receives the input voltage VIN with 3.3V, the transistor P4 is turned on, and the second control signal CS2 generated by the second terminal (such as the drain terminal) of the transistor P4 is the input voltage VIN with 3.3V. That is, the second control unit 140 generates the second control signal CS2 with 3.3V.

Then, since the first control signal CS1 is 3.3V and the second control signal CS2 is 3.3V, the transistor P5 is turned off and the transistor N6 is turned on, the voltage regulation unit 150 may decrease the voltage level of the input voltage VIN with 3.3V through the threshold voltage of the transistor N6, such as 3.3V-Vth. Then, the voltage regulation unit 150 uses the regulated voltage level (i.e., 3.3V-Vth) as the output voltage VOUT. In the embodiment, Vth is the threshold voltage of the transistor N6.

The output voltage VOUT generated by the voltage regulation unit 150 is, for example, the same as the predetermined value, and the output voltage VOUT is provided to the core circuit 160. Therefore, the voltage regulation circuit 100 may avoid situations wherein the unsuitable output voltage VOUT is provided to the core circuit 160, which may result in abnormal operation or damage to the core circuit 160, and increase the security and stability of the operation of the circuit.

In summary, according to the voltage regulation circuit disclosed by the embodiment of the present invention, the pull-down unit generates the pull-down voltage according to the input voltage. The first control unit generates the first control signal according to the input voltage and the pull-down voltage. The second control unit generates the second control signal according to the input voltage and the first control signal. The voltage regulation unit regulates the input voltage according to the first control signal and the second control signal, so as to generate the output voltage. Therefore, the embodiment of the present invention may effectively avoid situations wherein the unsuitable output voltage is provided to the core circuit, which may result in abnormal operation or damage to the core circuit, and increase the security and stability of the operation of the circuit.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage regulation circuit, suitable to provide an output voltage to a core circuit, wherein the voltage regulation circuit comprises:
   a pad, configured to receive and provide an input voltage;
   a pull-down unit, coupled to the pad, and configured to receive the input voltage and generate a pull-down voltage according to the input voltage;
   a first control unit, coupled to the pad and the pull-down unit, and configured to receive the input voltage and the pull-down voltage and generate a first control signal according to the input voltage and the pull-down voltage;
   a second control unit, coupled to the pad and the first control unit, and configured to receive the input voltage and the first control signal and generate a second control signal according to the input voltage and the first control signal; and
   a voltage regulation unit, coupled to the pad, the first control unit and the second control unit, and configured to receive the input voltage, the first control signal and the second control signal and regulate the input voltage according to the first control signal and the second control signal, so as to generate the output voltage;
   wherein the voltage regulation unit comprises:
   a first transistor, having a first terminal, a second terminal, a third terminal and a fourth terminal, wherein the first terminal of the first transistor receives the first control signal, the second terminal of the first transistor generates the output voltage, the third terminal of the first transistor is coupled to the pad and receives the input voltage, and the fourth terminal of the first transistor receives the second control signal; and
   a second transistor, having a first terminal, a second terminal, a third terminal and a fourth terminal, wherein the first terminal of the second transistor receives the second control signal, the second terminal of the second transistor is coupled to the second terminal of the first transistor, the third terminal of the second transistor is coupled to the third terminal of the first transistor, and the fourth terminal of the second transistor receives a first voltage.

2. The voltage regulation circuit as claimed in claim 1, wherein the pull-down unit comprises: an inverter, having an input terminal and an output terminal, wherein the input terminal of the inverter is coupled to the pad and receives the input voltage, and the output terminal of the inverter generates an inversion signal; and a third transistor, having a first terminal; a second terminal, a third terminal and a fourth terminal, wherein the first terminal of the third transistor is coupled to the output terminal of the inverter, the second terminal of the third transistor generates the pull-down voltage, and the third terminal and the fourth terminal of the third transistor receive the first voltage.

3. The voltage regulation circuit as claimed in claim 2, wherein the inverter comprises:
   a fourth transistor, having a first terminal, a second terminal, a third terminal and a fourth terminal, wherein the first terminal of the fourth transistor serves as the input terminal of the inverter, the second terminal of the fourth transistor serves as the output terminal of the inverter, and the third terminal and the fourth terminal of the fourth transistor receive a second voltage; and
   a fifth transistor, having a first terminal, a second terminal, a third terminal and a fourth terminal, wherein the first terminal of the fifth transistor is coupled to the first terminal of the fourth transistor, the second terminal of the fifth transistor is coupled to the second terminal of the fourth transistor, and the third terminal and the fourth terminal of the fifth transistor receive the first voltage.

4. The voltage regulation circuit as claimed in claim 1, wherein the first control unit comprises:
   a third transistor, having a first terminal, a second terminal, a third terminal and a fourth terminal, wherein the first terminal of the third transistor receives a second voltage, the second terminal of the third transistor is coupled to the pad, and the fourth terminal of the third transistor receives a first voltage;
   a fourth transistor, having a first terminal, a second terminal, a third terminal and a fourth terminal, wherein the first terminal and the second terminal of the fourth transistor are coupled to the third terminal of the third transistor, the third terminal of the fourth transistor generates the first control signal, and the fourth terminal of the fourth transistor receives the first voltage;
   a fifth transistor, having a first terminal, a second terminal, a third terminal and a fourth terminal, wherein the first terminal of the fifth transistor receives the second voltage, the second terminal of the fifth transistor is coupled to the third terminal of the fourth transistor, the third terminal of the fifth transistor is coupled to the pull-down unit and receives the pull-down voltage, and the fourth terminal of the fifth transistor receives the first voltage; and
   a sixth transistor, having a first terminal, a second terminal, a third terminal and a fourth terminal, wherein the first terminal of the sixth transistor receives the second voltage, the second terminal of the sixth transistor is coupled to the second terminal of the fifth transistor, the third terminal of the sixth transistor is coupled to the pad, and the fourth terminal of the sixth transistor receives the second control signal.

5. The voltage regulation circuit as claimed in claim 1, wherein the second control unit comprises:
   a third transistor, having a first terminal, a second terminal, a third terminal and a fourth terminal, wherein the first terminal of the third transistor receives the first control signal, the second terminal and the fourth terminal of the third transistor are coupled to each other and generate the second control signal, and the third terminal of the third transistor receives a second voltage; and
   a fourth transistor, having a first terminal, a second terminal, a third terminal and a fourth terminal, wherein the first terminal of the fourth transistor receives the second voltage, the second terminal and the fourth terminal of the fourth transistor are coupled to the second terminal of the third transistor, and the third terminal of the fourth transistor is coupled to the pad.

6. The voltage regulation circuit as claimed in claim 1, wherein when the input voltage is less than or equal to a predetermined value, the first control unit regulates a voltage level of the first control signal and the second control unit regulates a voltage level of the second control signal, so that the voltage regulation unit maintains a voltage level of the input voltage to generate the output voltage.

7. The voltage regulation circuit as claimed in claim 1, wherein when the input voltage is greater than a predetermined value, the first control unit regulates a voltage level of the first control signal and the second control unit regulates a voltage level of the second control signal, so that the voltage regulation unit decreases a voltage level provided by the input voltage to generate the output voltage.

\* \* \* \* \*